United States Patent
You et al.

(10) Patent No.: US 6,703,888 B1
(45) Date of Patent: *Mar. 9, 2004

(54) METHOD OF OPERATING CIRCUIT WITH FET TRANSISTOR PAIR

(75) Inventors: Budong You, Fremont, CA (US); Marco A. Zuniga, Dublin, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/327,586

(22) Filed: Dec. 20, 2002

Related U.S. Application Data

(63) Continuation of application No. 10/172,484, filed on Jun. 13, 2002, now Pat. No. 6,529,056, which is a continuation of application No. 09/853,356, filed on May 11, 2001, now Pat. No. 6,433,614, which is a continuation of application No. 09/798,008, filed on Mar. 2, 2001, now abandoned.

(51) Int. Cl.[7] .......................... H03K 17/687; H03K 5/22
(52) U.S. Cl. ........................ 327/427; 327/170; 327/389
(58) Field of Search ................................ 327/427, 431, 327/434, 435, 437, 328, 170, 108, 109, 111, 112, 386, 379, 310, 313, 389, 391; 326/85, 86, 87, 26, 27

(56) References Cited

U.S. PATENT DOCUMENTS

| | | | |
|---|---|---|---|
| 4,749,882 A | 6/1988 | Morgan | |
| 4,918,339 A | 4/1990 | Shigeo et al. | |
| 5,483,188 A | 1/1996 | Frodsham | |
| 5,486,782 A | 1/1996 | Chan | |
| 5,701,090 A | 12/1997 | Hidaka et al. | |
| 5,726,589 A | 3/1998 | Cahill et al. | |
| 5,777,944 A | 7/1998 | Knaack et al. | |
| 5,852,579 A | 12/1998 | Arcoleo et al. | |
| 5,889,420 A | 3/1999 | Poechmueller | |
| 6,172,516 B1 | 1/2001 | Han et al. | |

Primary Examiner—My-Trang Nuton
(74) Attorney, Agent, or Firm—Fish & Richardson P.C.

(57) ABSTRACT

A method for use with a switch having a field-effect transistor (FET). The method includes restricting the drain-source voltage of the FET to a predetermined range, and then switching the FET. In general, in one aspect, the invention features a circuit having source, drain and gate terminals. The circuit includes a first FET having a first drain coupled to the drain terminal and a first source coupled to the source terminal, a second FET having a second drain coupled to the drain terminal and a second source coupled to the source terminal, and a control circuit coupled to the gate terminal, the first gate, and the second gate.

14 Claims, 5 Drawing Sheets

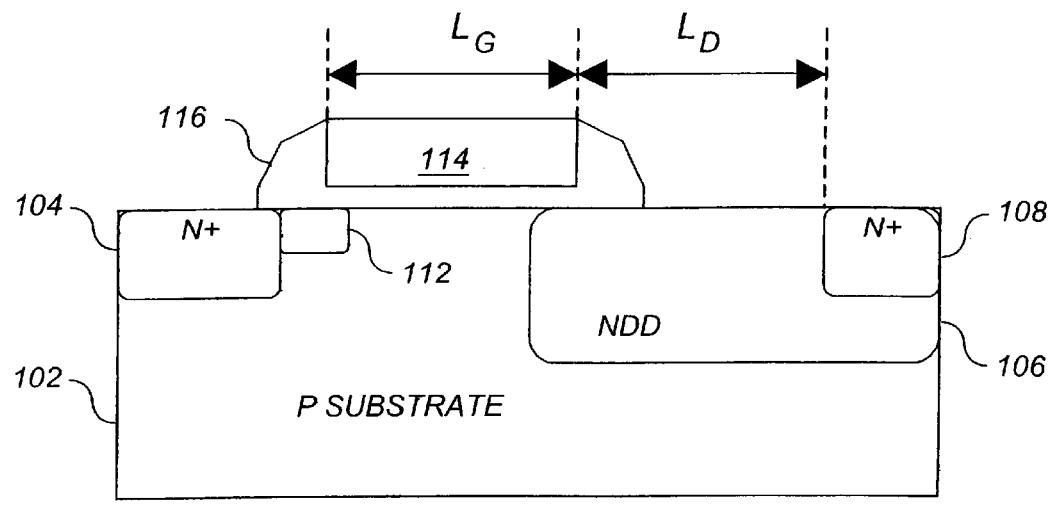
FIG._1
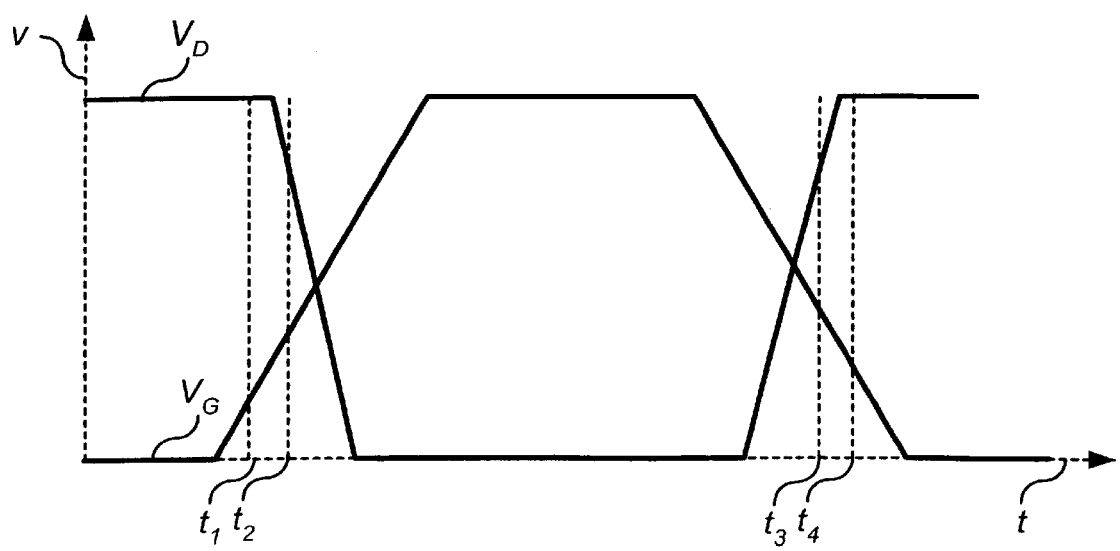
FIG._2

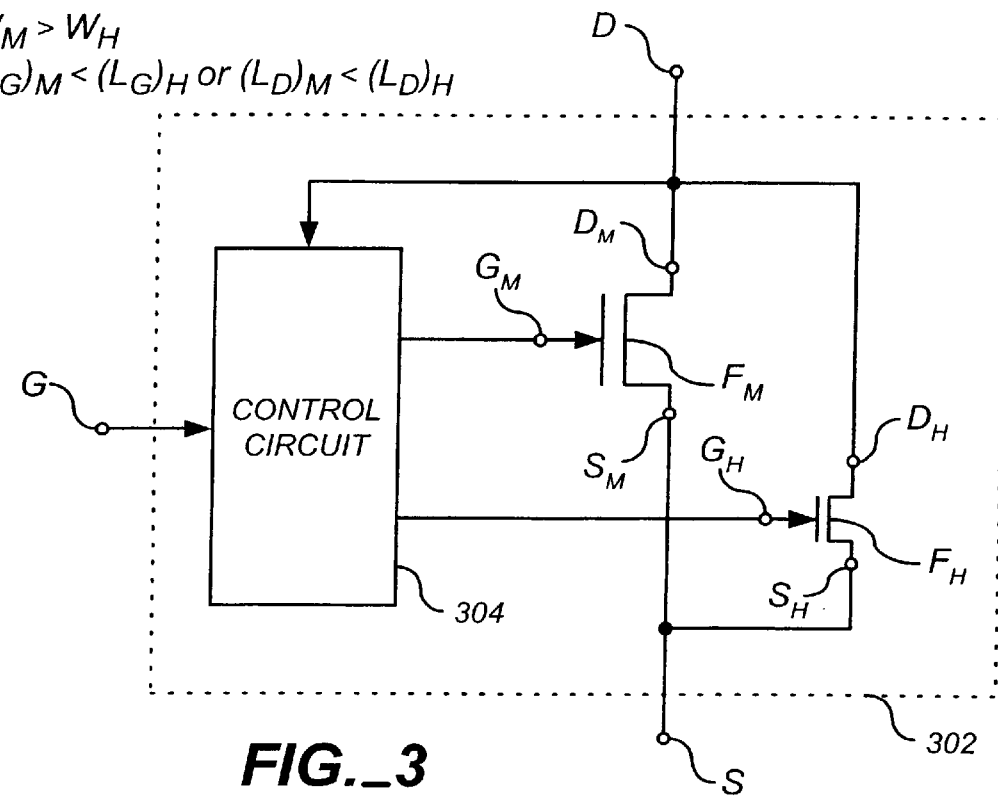
FIG._3
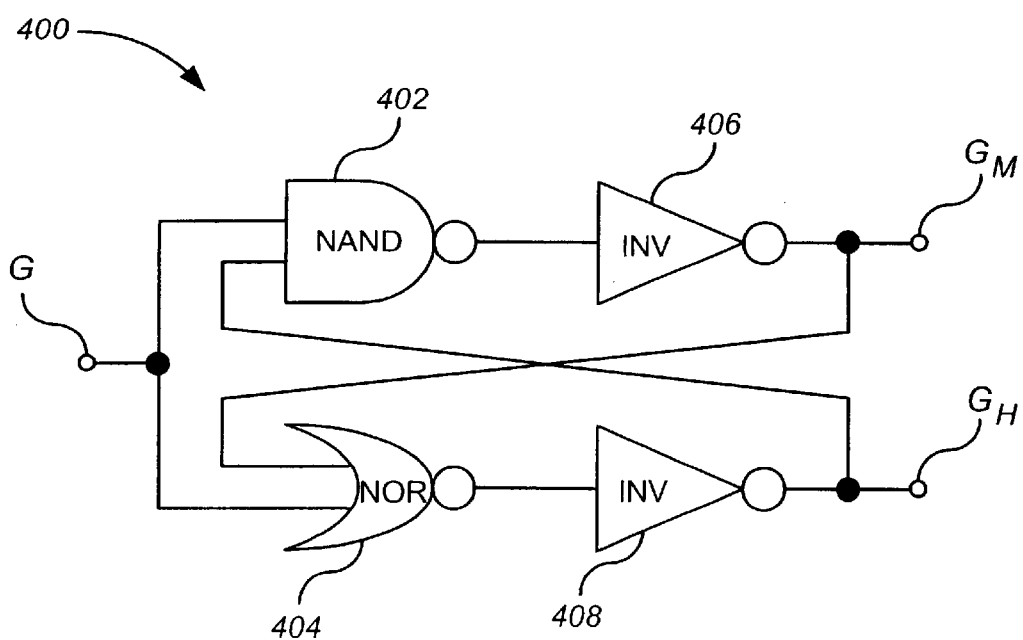
FIG._4

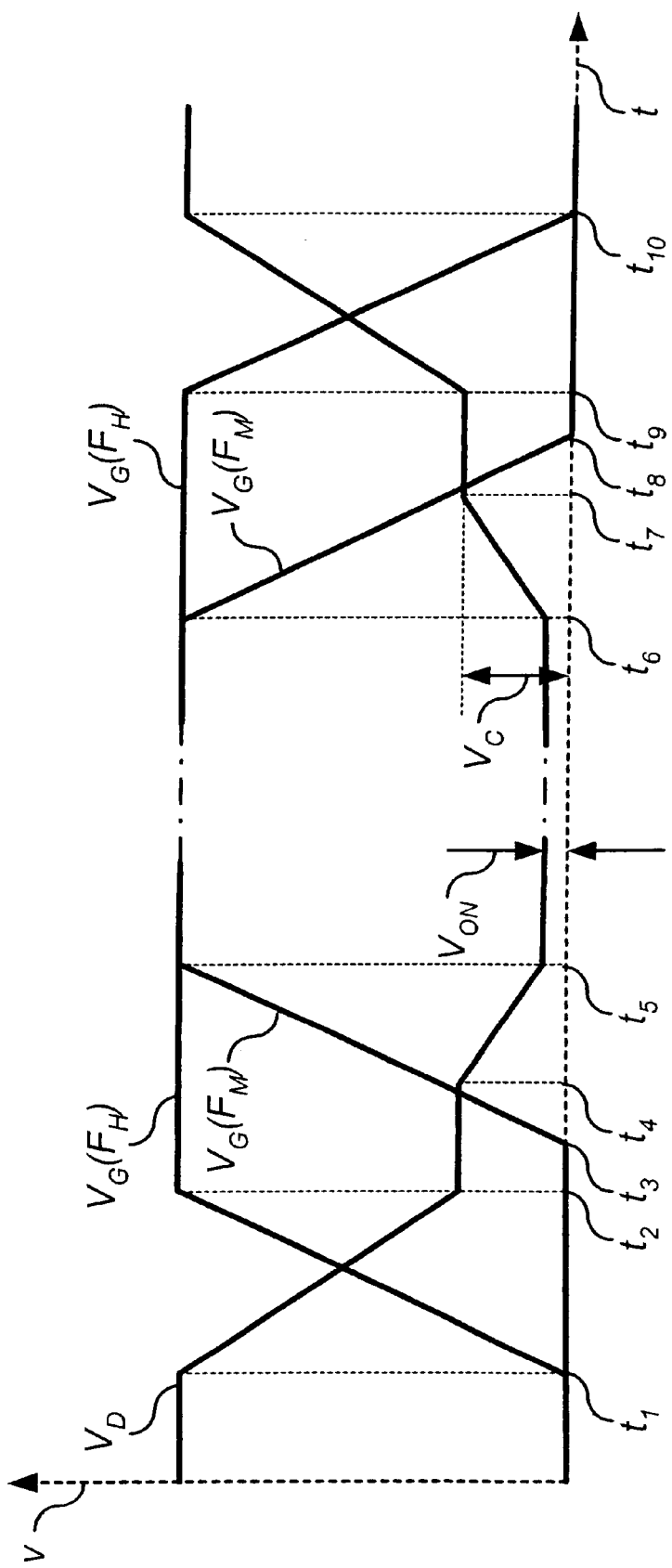
FIG._5

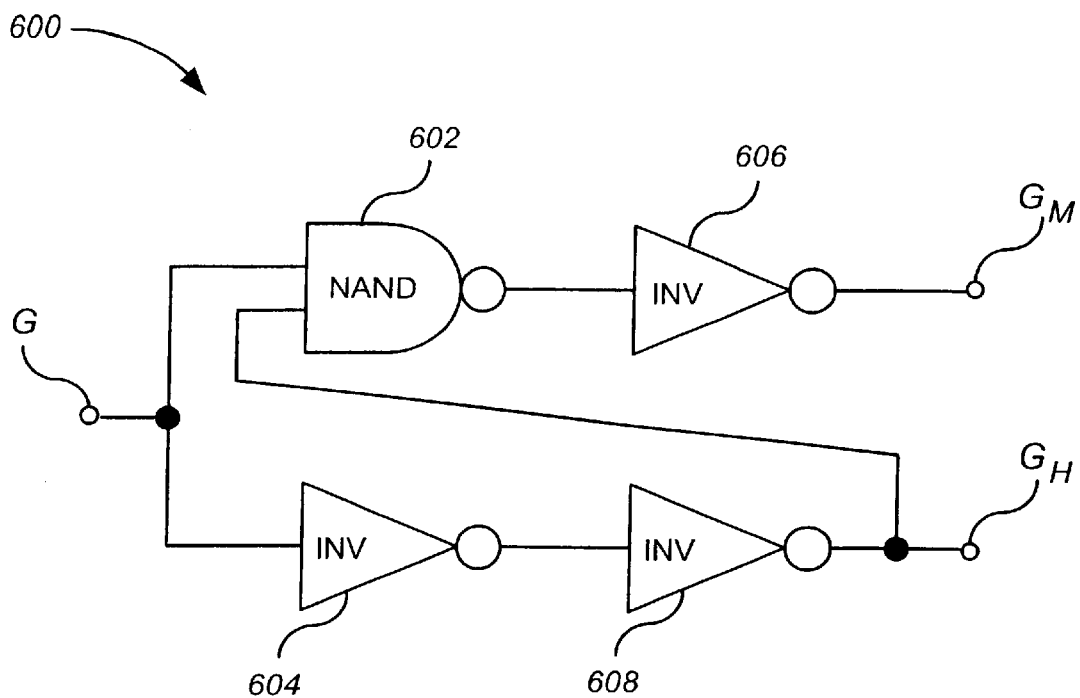
FIG._6
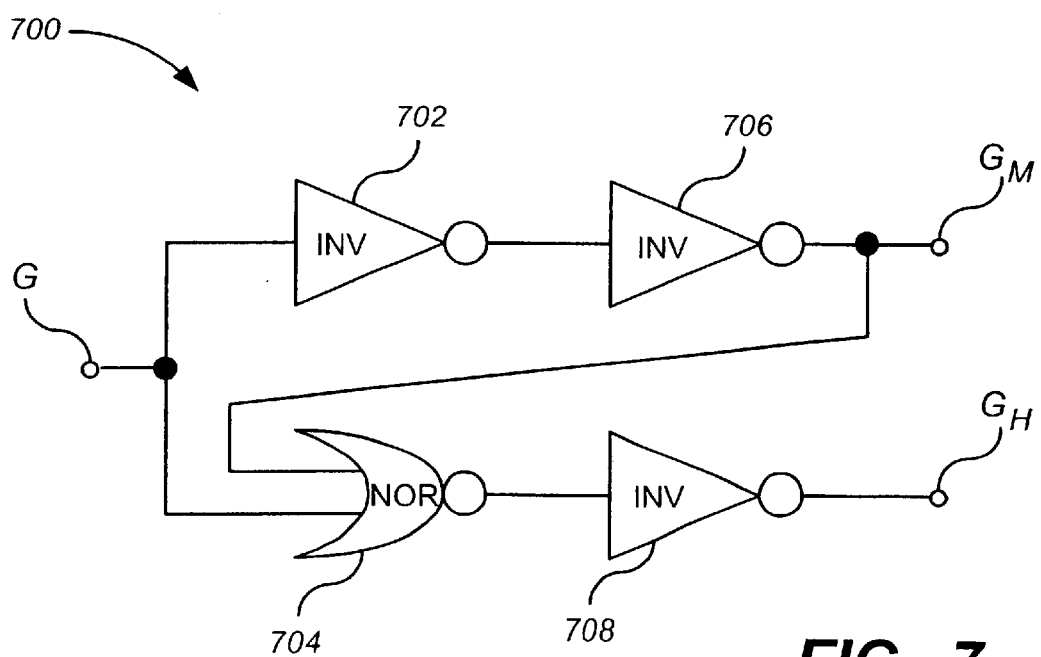
FIG._7

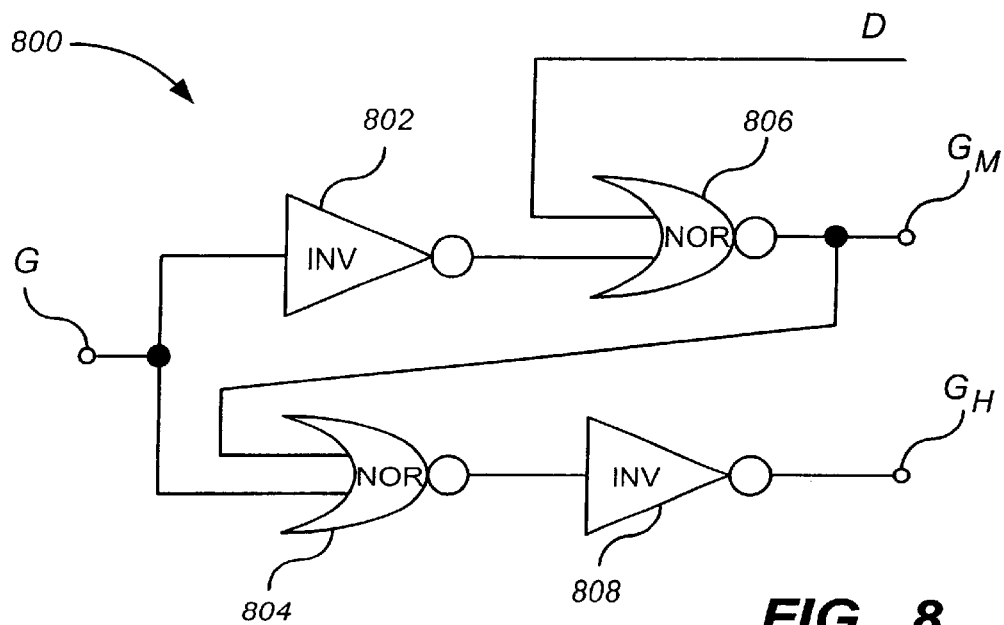
FIG._8
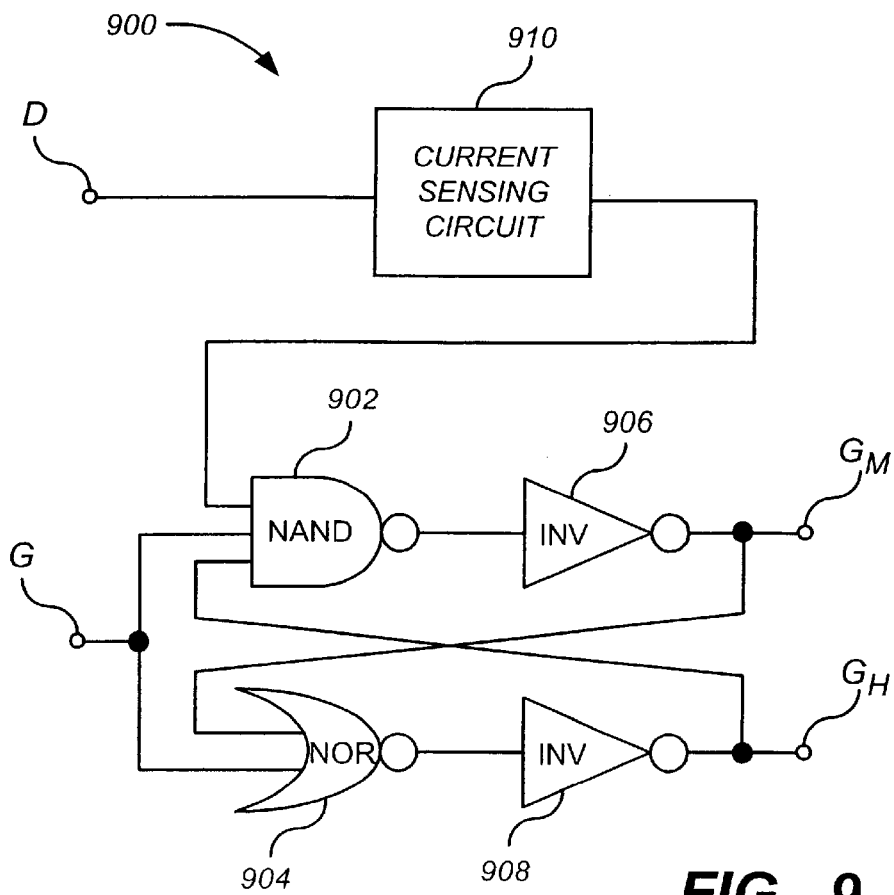
FIG._9

METHOD OF OPERATING CIRCUIT WITH FET TRANSISTOR PAIR

CROSS-REFERENCE TO RELATED APPLICATIONS

This application is a continuation of U.S. application Ser. No. 10/172,484, filed Jun. 13, 2002, now U.S. Pat. No. 6,529,056 which is a continuation of U.S. application Ser. No. 09/853,356, filed May 11, 2001, now U.S. Pat. No. 6,433,614, which is a continuation of U.S. application Ser. No. 09/798,008, filed Mar. 2, 2001, now abandoned, the entire contents of which are hereby incorporated by reference.

BACKGROUND

This invention relates to transistor switches, and more particularly to metal oxide semiconductor field-effect transistor (MOSFET) switches.

In power management ICs having a monolithically integrated MOSFET power train, the on-chip field-effect transistor (FET) not only accounts for most of the power dissipation, but also consumes a significant amount of silicon area, and very often is the major concern regarding the long-term reliability of the chip.

FIG. 1 shows a cross-sectional view of a conventional asymmetric high-voltage NMOS transistor, compatible with standard CMOS processes, with N deep drain (NDD) implantation. Although implementations of the inventions are described with reference to an asymmetrical device, the invention applies to all MOSFET devices.

A N+ source 104 is formed within a P substrate 102. Also formed in the substrate is a NDD region 106 that includes a N+ drain implant 108, and a N lightly doped drain (LDD) implant 112. Formed upon substrate 102 is a LDD that includes a gate 114.

Two important dimensions in this device structure are the length $L_G$ of gate 114 and the spacing $L_D$ between the drain N+ implant 108 and gate 114. The design rules for these two dimensions are set to meet two specifications: punch-through breakdown voltage, and hot-carrier lifetime.

Quite often, it is the reliability specification, also referred to as the hot-carrier lifetime specification, instead of the punch-through breakdown voltage specification, that determines the design rule, which dictates the minimum allowed dimensions of $L_G$ and $L_D$.

In other words, in the applications where hot-carrier degradation is not of concern, a more aggressive design rule can be used to design a transistor such as that shown in FIG. 1 while still meeting the same punch-through breakdown voltage specification. A FET structure with smaller dimensions on $L_G$ or $L_D$ is preferred because it not only reduces the overall chip area, but also reduces the on resistance and the junction capacitance of the FET, thus improving the overall system efficiency.

It is known that hot-carrier injection (HCI) occurs at the overlapping period between the transitions of the gate voltage and drain voltage of the FET, with the injection peaking when the gate voltage is approximately one half of the drain voltage. As a result, the typical inverter application turns out to be a stressful operation for the FET in terms of hot-carrier degradation. HCI is discussed in greater detail in W. Weber, C. Werner and A. V. Schwerin, "Lifetimes and substrate current in static and dynamic hot-carrier degradation," *IEDM* 86, pp 390–393, 1986.

FIG. 2 is a conceptual time t versus voltage v plot of voltage waveforms for a conventional N-FET during the switching transitions of a typical inverter mode operation. During the turn-on transition, the drain voltage $V_D$ goes low and the gate voltage $V_G$ goes high. During the turn-off transition, $V_P$ goes high and $V_G$ goes low. The area between times $t_1$ and $t_2$ and $t_3$ and $t_4$ shows the transition period during which a strong hot-carrier injection occurs. Hot-carrier degradation results in threshold voltage shift and transconductance degradation for the N-FET. Due to the hot-carrier degradation concern, the conventional design of a FET switch typically involves trade-offs between electrical performance, such as on resistance, and reliability performance, such as hot-carrier lifetime. In general, making a conventional device more resilient to hot carrier degradation involves increasing one or both of $L_G$ and $L_D$, while improving electrical performance (and minimizing device area) involves minimizing $L_G$ and $L_D$.

SUMMARY

In general, in one aspect, the invention features a method and computer program product for use with a switch having a field-effect transistor (FET). It includes restricting the drain-source voltage of the FET to a predetermined range; and then switching the FET.

Particular implementations can include one or more of the following features. It includes delaying switching for a predetermined period of time after restricting. It includes delaying switching for a period of time after restricting that is determined by the drain-source voltage of the FET. It includes releasing the drain-source voltage of the FET after switching. The switch includes a further FET having a drain coupled to the drain of the FET and a source coupled to the source of the FET, and restricting includes controlling the further FET. Restricting includes turning on the further FET; and switching includes turning on the FET. Restricting includes keeping the further FET on; and switching includes turning off the FET. It includes keeping the FET off when the current at the drain is below a predetermined threshold current.

In general, in one aspect, the invention features a circuit having source, drain and gate terminals. It includes a first field-effect transistor (FET) having a first drain coupled to the drain terminal and a first source coupled to the source terminal; a second FET having a second drain coupled to the drain terminal and a second source coupled to the source terminal; and a control circuit coupled to the gate terminal, the first gate, and the second gate.

Particular implementations can include one or more of the following features. The control circuit is coupled to the drain terminal. The control circuit is configured to turn on the second FET before turning on the first FET. The control circuit is configured to impose a fixed delay between turning off the first and second FETs. The control circuit is configured to impose a delay between turning on the first and second FETs, the duration of the delay determined by the voltage between the drain and source terminals. The control circuit is configured to turn off the second FET after turning off the first FET. The control circuit is configured to impose a fixed delay between turning on the first and second FETs. The first FET is designed for superior electrical performance. The second FET is designed for superior reliability performance. The first and second FETs are implemented as a single monolithic device. The first and second FETs and the control circuit are implemented as a single monolithic device. The circuit includes a current sensing circuit configured to keep the first FET off when the current at the drain terminal is below a predetermined threshold current.

Advantages that can be seen in implementations of the invention include one or more of the following. Implementations of the invention provide cost reduction, efficiency improvement and reliability enhancement in switching applications. Because the helper FET only accounts for a small percentage of the total FET switch size, designers can cut the overall FET switch area while improving overall switching efficiency. This approach successfully overcomes the tradeoff between electrical performance and reliability performances of conventional MOSFET switches.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 shows a cross-sectional view of a conventional asymmetric high-voltage NMOS transistor.

FIG. 2 is a time t versus voltage v plot of voltage waveforms for a conventional N-FET during the turn-on transition of a typical inverter mode operation.

FIG. 3 is a block diagram of a FET switch according to one implementation.

FIG. 4 depicts a circuit for use in an FET control circuit according to one implementation.

FIG. 5 shows a timing diagram for three of the voltage waveforms for a switch according to one implementation.

FIG. 6 depicts a circuit for use in an FET control circuit according to another implementation.

FIG. 7 depicts a circuit for use in an FET control circuit according to still another implementation.

FIG. 8 depicts a circuit for use in an FET control circuit according to yet another implementation.

FIG. 9 depicts a circuit for use in an FET control circuit according to another implementation.

Like reference symbols in the various drawings indicate like elements.

DETAILED DESCRIPTION

FIG. 3 is a block diagram of a FET switch 302 according to one implementation. Switch 302 includes a main FET $F_M$, a helper FET $F_H$, and a control circuit 304. Control circuit 304 controls the timing of the operation of the main and helper FETs. The main FET is designed for superior electrical performance, while the helper FET is designed for superior reliability performance. The helper FET controls the drain voltage of the main FET during the switching transition of the main FET.

The drain $D_M$ of the main FET is coupled to the drain $D_H$ of the helper FET to form the drain D of switch 302. The source $S_M$ of the main FET is coupled to the source $S_H$ of the helper FET to form the source S of switch 302. Control circuit 304 receives the signals applied to the gate G of switch 302. In some implementations, control circuit 304 also receives the signals applied to the drain D of switch 302.

Control circuit 304 controls the timing of the gate signal $G_M$ for the main FET and the gate signal $G_H$ for helper FET such that the main FET operates at a stress-free biasing condition under any switching scenario.

FIG. 4 depicts a circuit 400 for use in control circuit 304 according to one implementation. The inputs of a NAND gate 402 are coupled to terminals G and $G_H$. The inputs of a NOR gate 404 are coupled to terminals G and $G_M$. The output of NAND gate 402 is coupled to the input of an inverter 406. The output of inverter 406 is coupled to terminal $G_M$. The output of NOR gate 404 is coupled to the input of an inverter 408. The output of inverter 408 is coupled to terminal $G_H$.

FIG. 5 shows a timing diagram for three of the voltage waveforms for switch 302 according to one implementation. $V_D$ is the voltage appearing at terminal D. $V_G(F_H)$ is the voltage applied to terminal $G_H$ by control circuit 304. $V_G(F_M)$ is the voltage applied to terminal $G_M$ by control circuit 304. $V_G$ is the voltage appearing at terminal G. $V_G$ is substantially similar to $V_G(F_H)$ during the turn-on transition, and is substantially similar to $V_G(F_M)$ during the turn-off transition. Therefore, for clarity, $V_G$ is not shown.

A turn-on transition is shown from time $t_1$ to time $t_5$. At $t_1$, $V_G$ begins to rise. Switch 302 responds by turning on the helper FET. Control circuit 304 turns on the helper FET by asserting a high voltage $V_G(F_H)$ at terminal $G_H$. Consequently, $V_G(F_H)$ begins to rise, and $V_D$ begins to drop. At time $t_2$, the helper FET is on, so $V_G(F_H)$ is high and $V_D$ is clamped at $V_C$.

At time $t_3$, switch 302 turns on the main FET. The main FET can be turned on before the helper FET is completely on, as long as the drain voltage has dropped to a level at which HCI is no longer a concern. Control circuit 304 turns on the main FET by asserting a high voltage $V_G(F_M)$ at terminal $G_M$. At time $t_4$, $V_D$ begins to fall from $V_C$ to $V_{ON}$. At time $t_5$, the main FET is on, so $V_G(F_M)$ is high and $V_D$ has reached $V_{ON}$. As can be seen, control circuit 304 delays the main FET transition for a fixed delay time $T_{D1}=t_3-t_1$. Delay time $T_{D1}$ can be increased by adding more buffer stages to control circuit 304.

A turn-off transition is shown from time $t_6$ to time $t_{10}$. At time $t_6$, $V_G$ begins to fall. Switch 302 responds by turning off the main FET. Control circuit 304 turns off the main FET by asserting a low voltage $V_G(F_M)$ at terminal $G_M$. Consequently, $V_G(F_M)$ begins to fall.

Depending on load conditions, $V_D$ may rise. The portion of the $V_D$ curve shown from time $t_6$ to time $t_{10}$ represents the maximum voltage $V_D$ is allowed to reach. Switch 302 keeps $V_D$ at or below this maximum.

At time $t_7$, $V_D$ is restricted to at or below $V_C$. At time $t_8$, the main FET is off.

At time $t_9$, switch 302 turns off the helper FET. The helper FET can be turned off before the main FET is completely off, as long as the drain voltage remains at a level at which HCI is no longer a concern. Control circuit 304 turns off the helper FET by asserting a low voltage $V_G(F_H)$ at terminal $G_H$. Consequently, $V_D$ is no longer clamped at or below $V_C$, and so $V_D$ may rise. At time $t_{10}$, the helper FET is off, so $V_G(F_H)$ is low and $V_D$ can be high. As can be seen, control circuit 304 delays the helper FET transition for a fixed delay time $T_{D2}=t_9-t_6$. Delay time $T_{D2}$ can be increased by adding more buffer stages to control circuit 304.

As can be seen from FIG. 5, in the static state, the main FET and helper FET operate in parallel. However, their operations differ during the switching transient period. The helper FET turns on before the main FET turns on, thereby lowering the voltage across the main FET during its turn-on transition. The helper FET also turns off after the main FET turns off, thereby limiting the voltage across the main FET during its turn-off transition. Therefore, the main FET experiences no HCI stress.

Because the main FET is now free of the reliability design constraint, it can be designed for optimal electrical performance. For example, the main FET can use more aggressive design rules than the conventional FET not only to reduce the silicon area, but also to improve the efficiency of switch 302. On the other hand, because the helper FET sustains all the HCI stress, it is designed for robust and reliable performance. The helper FET can use conventional or even more conservative design rules to achieve this performance.

The magnitude of the benefits of switch 302 is a function of the relative size (or channel width) of the main FET and the helper FET. Only the main FET portion contributes in terms of area saving and efficiency improvement. Therefore the smaller the helper FET is relative to the main FET, the greater the benefit.

The overall size of switch 302, including both the main FET and the helper FET, is a function of the on-state voltage drop ($V_{ON}$) requirement. In switching applications, $V_{ON}$ typically is a very low voltage level. The helper FET alone is on to clamp the drain of the main FET at a voltage lower than the blocking voltage that it will otherwise sees in conventional switching. Blocking voltage is the voltage that the switch sustains in the off state. The relative size of the helper FET to the size of the helper FET and the main FET combined is inversely proportional to the ratio of clamped voltage ($V_C$) to $V_{ON}$.

Hot-carrier injection quickly subsides as $V_C$ decreases from the blocking voltage. Therefore, $V_C$ can be much higher than zero while still being low enough to protect the main FET from hot-carrier stress. Indeed, $V_C$ in switch 302 actually has a much greater voltage range than conventional switching modes.

FIG. 6 depicts a circuit 600 for use in control circuit 304 according to another implementation. The inputs of a NAND gate 602 are coupled to terminals G and $G_H$. The input of an inverter 604 is coupled to terminal G. The input of an inverter 606 is coupled to the output of NAND gate 602. The output of inverter 606 is coupled to terminal $G_M$. The output of inverter 604 is coupled to the input of an inverter 608. The output of inverter 608 is coupled to terminal $G_H$. As can be seen, circuit 600 delays the main FET transition for a fixed delay time $T_{D1}=t_3-t_1$. Circuit 600 implements the timing of FIG. 5 only for the turn-on transition of switch 302.

FIG. 7 depicts a circuit 700 for use in control circuit 304 according to still another implementation. The input of an inverter 702 is coupled to terminal G. The inputs of a NOR gate 704 are coupled to terminals G and $G_M$. The input of an inverter 706 is coupled to the output of inverter 702. The output of inverter 706 is coupled to terminal $G_M$. The output of NOR gate 704 is coupled to the input of an inverter 708. The output of inverter 708 is coupled to terminal $G_H$. Circuit 700 implements the timing of FIG. 5 only for the turn-off transition of switch 302.

FIG. 8 depicts a circuit 800 for use in control circuit 304 according to yet another implementation. The input of an inverter 802 is coupled to terminal G. The inputs of a NOR gate 804 are coupled to terminals G and $G_M$. The inputs of a NOR gate 806 are coupled to terminal D and the output of inverter 802. The input of an inverter 808 is coupled to the output of NOR gate 804. The output of inverter 808 is coupled to terminal $G_H$. Circuit 800 implements the timing of FIG. 5 only for the turn-on transition of switch 302.

Circuit 800 implements a variable delay $T_{DV}=t_3-t_1$ during the turn-on transition of switch 302, when the effects of HCI are more severe than during the turn-off transition. The turn-on of the main FET is delayed until the drain voltage $V_D$ falls below a predetermined voltage. In this implementation, $V_C$ is designed to be within the range of an effective logic "low." Circuit 800 implements a fixed delay $T_{D2}=t_9-t_6$ during the turn-off transition of switch 302.

In one implementation 304 includes a current sensing circuit. When the load current falls below a predetermined threshold, 304 shuts off main FET $F_M$. Switching is then accomplished by helper FET $F_H$ alone.

For a given size for switch 302, the conduction loss of switch 302 decreases with decreases in DC load current. When switch 302 is operated at light load current condition, the power losses incurred by charging up the gate capacitance of switch 302 (including both the main FET and the helper FET) may dominate the overall loss of switch 302. Therefore the conduction loss of switch 302 becomes negligible, and the overall efficiency of switch 302 improves due to the dramatic reduction of gate capacitance and charging loss associated with the gate capacitance. In this situation, it is useful to disable the main FET and use the helper FET only.

FIG. 9 depicts a circuit 900 for use in control circuit 304 according to this implementation. The inputs of a NAND gate 902 are coupled to terminals G and $G_H$, and to the output of a current sensing circuit 910. The inputs of a NOR gate 904 are coupled to terminals G and $G_M$. The output of NAND gate 902 is coupled to the input of an inverter 906. The output of inverter 906 is coupled to terminal $G_M$. The output of NOR gate 904 is coupled to the input of an inverter 908. The output of inverter 908 is coupled to terminal $G_H$.

Current sensing circuit 910 outputs a logic high level when the drain current (that is, the current at drain D) is greater than a predetermined threshold current (indicating a normal load). Current sensing circuit 910 outputs a logic low level when the drain current is less than the predetermined threshold current (indicating a light load). Such current sensing circuits are well-known in the relevant arts. Circuit 900 thus operates in a manner similar to circuit 400 in FIG. 4 under normal loads. However, under light loads, circuit 900 keeps the main FET shut off at all times, while the helper FET is free to carry out the function of switch 302.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of embodiments of the invention have been described. Nevertheless, it will be understood that various modifications may be made without departing from the spirit and scope of the invention. For example, switch 302 can be implemented monolithically, or as two or more discrete components. The main FET, the helper FET, or both can be implemented as a single FET or as many FETs operating together. Switch 302 can be implemented using N-type MOSFETs or P-type MOSFETs. Switch 302 can be implemented to affect only the turn-on transition, only the turn-off transition, or both. Switch 302 can be implemented to drive capacitive, resistive or inductive loads. Accordingly, other embodiments are within the scope of the following claims.

What is claimed is:

1. A method of operating a switch having a source terminal and a drain terminal, comprising:

turning on a helper field-effect transistor (FET) that has a first drain coupled to the drain terminal, a first source coupled to the source terminal, and a first gate;

turning on a main FET while the helper FET is on, the main FET having a second drain coupled to the drain terminal, a second source coupled to the source terminal, and a second gate, and wherein the main FET has an $L_G$ greater than the $L_G$ of the helper FET or an $L_D$ greater than the $L_D$ of the helper FET;

turning off the main FET while the helper FET is on; and turning off the helper FET.

2. The method of claim 1, wherein the turning on and off the main FET and helper FET includes directing signals from a control circuit to the first and second gates.

3. The method of claim 2, further comprising receiving a signal in the control circuit from the drain terminal.

4. The method of claim 1, further comprising delaying turning on the main FET for a predetermined period of time after turning on the helper FET.

5. The method of claim 1, further comprising determining a voltage between the drain and source terminals.

6. The method of claim 5, further comprising delaying turning on the main FET until the voltage between the drain and source terminals falls below a predetermined voltage.

7. The method of claim 1, further comprising delaying turning off the helper FET for a predetermined period of time after turning off the main FET.

8. The method of claim 1, further comprising determining a load current at the drain terminal.

9. The method of claim 8, further comprising disabling the main FET when the load current at the drain terminal is below a predetermined threshold current.

10. The method of claim 9, further comprising switching the helper FET when the main FET is disabled.

11. The method of claim 1, wherein the main FET is designed for electrical performance superior to that of the helper FET.

12. The method of claim 1, wherein the helper FET is designed for reliability performance superior to that of the main FET.

13. The method of claim 1, wherein the main FET and helper FET are implemented as a single monolithic device.

14. The method of claim 1, wherein the helper FET has an area less than the area of the main FET.

\* \* \* \* \*